(12) United States Patent
Perruchot et al.

(10) Patent No.: US 8,513,042 B2
(45) Date of Patent: Aug. 20, 2013

(54) METHOD OF FORMING AN ELECTROMECHANICAL TRANSDUCER DEVICE

(75) Inventors: Francois Perruchot, Grenoble (FR); Lianjun Liu, Chandler, AZ (US); Sergio Pacheco, Scottsdale, AZ (US); Emmanuel Defay, Voreppe (FR); Patrice Rey, Saint Jean de Moirans (FR)

(73) Assignees: Freescale Semiconductor, Inc., Austin, TX (US); Commissariat à l'Energie Atomique et aux Energies Alternatives (CEA), Paris (FR)

(*) Notice: Subject to any disclaimer, the term of this patent is extended or adjusted under 35 U.S.C. 154(b) by 0 days.

(21) Appl. No.: 13/320,579

(22) PCT Filed: Jun. 15, 2010

(86) PCT No.: PCT/IB2010/001950
§ 371 (c)(1),
(2), (4) Date: Nov. 15, 2011

(87) PCT Pub. No.: WO2011/001293
PCT Pub. Date: Jan. 6, 2011

(65) Prior Publication Data
US 2012/0056308 A1    Mar. 8, 2012

(30) Foreign Application Priority Data

Jun. 29, 2009 (WO) ............... PCT/IB2009/053235

(51) Int. Cl.
*H01L 21/00* (2006.01)
(52) U.S. Cl.
USPC ............. 438/52; 438/17; 438/50; 438/54; 257/415; 257/417; 257/467
(58) Field of Classification Search
CPC ............. B81C 1/00666; B81C 2201/0169; B81C 2201/0163; B81C 2201/017
USPC ............. 438/17, 50, 52, 54; 257/415, 417, 257/418, 467
See application file for complete search history.

(56) References Cited

U.S. PATENT DOCUMENTS 5,796,152 A   8/1998  Carr et al.
6,309,048 B1  10/2001  Silverbrook
(Continued)

FOREIGN PATENT DOCUMENTS

WO   2010061363 A2   6/2010
WO   2010061364 A2   6/2010

OTHER PUBLICATIONS

Pulskamp, Jeffrey S. et al: "Mitigation of Residual Film Stress Deformation in Multilayer Microelectromechanical Systems Cantilever Devices" IEEE, Journal of Vacuum Science & Technology B: Microelectronics and Nanometer Structures, Nov. 2003, vol. 21, Issue 6, pp. 2482-2486.

(Continued)

*Primary Examiner* — N Drew Richards
*Assistant Examiner* — Jay C Chang

(57) ABSTRACT

A method of forming an electromechanical transducer device comprises forming on a fixed structure a movable structure and an actuating structure of the electromechanical transducer device, wherein the movable structure is arranged in operation of the electromechanical transducer device to be movable in relation to the fixed structure in response to actuation of the actuating structure. The method further comprises providing a stress trimming layer on at least part of the movable structure, after providing the stress trimming layer, releasing the movable structure from the fixed structure to provide a released electromechanical transducer device, and after releasing the movable structure changing stress in the stress trimming layer of the released electromechanical transducer device such that the movable structure is deflected a predetermined amount relative to the fixed structure when the electromechanical transducer device is in an off state.

14 Claims, 11 Drawing Sheets

(56) References Cited

U.S. PATENT DOCUMENTS

| | | | |
|---|---|---|---|
| 6,631,979 | B2 | 10/2003 | Lebens et al. |
| 6,639,713 | B2 * | 10/2003 | Chiu et al. .................... 359/318 |
| 6,700,309 | B2 | 3/2004 | Dausch et al. |
| 6,746,891 | B2 | 6/2004 | Cunningham et al. |
| 7,675,222 | B2 | 3/2010 | Kawakubo et al. |
| 7,919,903 | B2 | 4/2011 | Hong et al. |
| 2002/0043895 | A1 | 4/2002 | Richards et al. |
| 2003/0062332 | A1 | 4/2003 | Harris et al. |
| 2003/0227234 | A1 | 12/2003 | Namerikawa et al. |
| 2005/0116798 | A1 | 6/2005 | Bintoro et al. |
| 2005/0127792 | A1 | 6/2005 | Mehta |
| 2005/0275696 | A1 | 12/2005 | Miyazawa et al. |
| 2006/0204776 | A1 | 9/2006 | Chen et al. |
| 2007/0257766 | A1 | 11/2007 | Richards et al. |
| 2008/0002299 | A1 | 1/2008 | Thurn |
| 2008/0169724 | A1 | 7/2008 | Bhattacharjee et al. |
| 2008/0202239 | A1 | 8/2008 | Fazzio et al. |
| 2009/0026892 | A1 | 1/2009 | Nakamura et al. |
| 2011/0221307 | A1 | 9/2011 | Liu et al. |
| 2011/0233693 | A1 | 9/2011 | Perruchot et al. |

OTHER PUBLICATIONS

Jiang, Hong Wen et al: "Fabrication of PZT Actuated Cantilevers on Silicon-on-Insulator Wafers for a RF Microswitch" Micromachining and Microfabrication Process Technology VIII, San Jose, CA, USA, 2003, pp. 165-173.

Lee, Hee-Chul et al: "Design, Fabrication and RF Performances of Two Different Types of Piezoelectrically Actuated Ohmic MEMS Switches" Journal of Micromechanics and Microengineering, 2005, vol. 15 No. 11.

International Search Report and Written Opinion correlating to PCT/IB2009/053235 dated May 18, 2010.

Notice of Allowance mailed Jan. 23, 2013 for U.S. Appl. No. 13/128,035, 15 pages.

Hsueh, C.H. et al., "Thermal Stresses in Elastic Multilayer Systems," Thin Solid Films, copyright 2002 Elsevier Science B.V.; vol. 418, issue 2; Oct. 2002; pp. 182-188.

Lee, Hee-Chul et al., "Design, Fabrication and RF Performances of Two Different Types of Piezoelectrically Actuated Obmic MEMS Switches," Journal of Micromechanics & Microengineering, Institute of Physics Publishing, Bristol, GB; vol. 15, No. 11; Nov. 2005; pp. 2098-2104.

Pulskamp, J. et al., "Mitigation of Residual Film Stress Deformation in Multilayer Microelectromechanical Ssytems Cantilever," IEEE Journal of Vacuum Science & Technology B: Microelectronic and Nanometer Structures; vol. 21, issue 6; Nov. 2003; pp. 2482-2486.

Zhu, Hong et al., "Membrane Microcantilever Array Fabrication with PZT Thin Films for Nanorange Movement," Microsystem Technologies; Micro and Nansystems Information Storage and Processing Systems, Springer, Berlin, DE; vol. 11, No. 8-10, Aug. 1, 2005, pp. 1121-1126.

International Search Report mailed May 12, 2010 for International Application No. PCT/IB2009/056020, 3 pages.

International Search Report mailed May 17, 2010 for International Application No. PCT/IB2009/056019, 3 pages.

Non-Final Office Action mailed May 15, 2013 for U.S. Appl. No. 13/128,032, 23 pages.

* cited by examiner

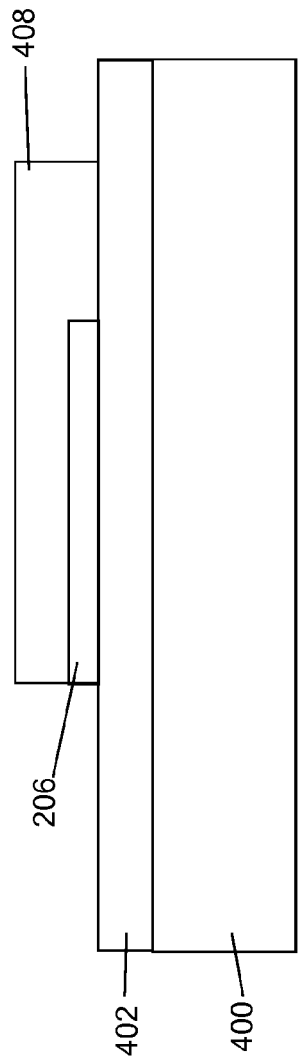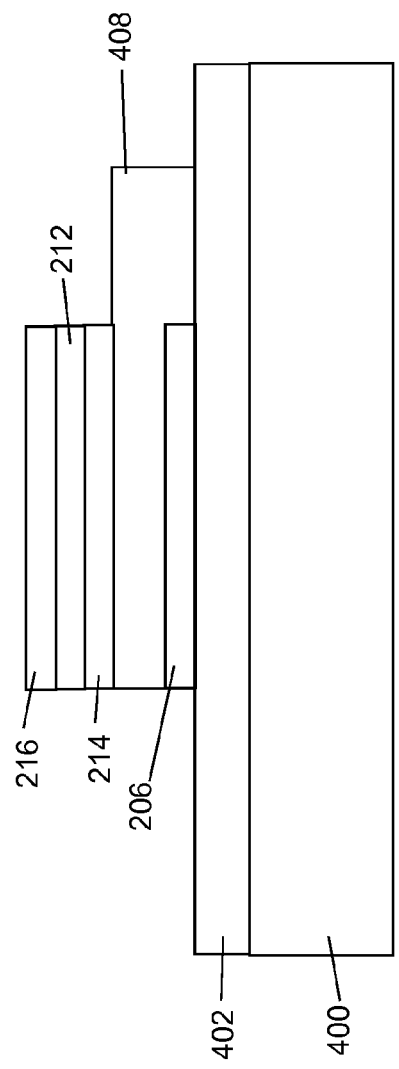

METHOD OF FORMING AN ELECTROMECHANICAL TRANSDUCER DEVICE

CROSS-REFERENCE TO RELATED APPLICATIONS

The present application is related to co-pending U.S. patent application Ser. No. 13/128,032, entitled "ELECTROMECHANICAL TRANSDUCER DEVICE AND METHOD OF FORMING A ELECTROMECHANICAL TRANSDUCER DEVICE" filed on May 6, 2011, and U.S. patent application Ser. No. 13/128,035, entitled "ELECTROMECHANICAL TRANSDUCER DEVICE AND METHOD OF FORMING A ELECTROMECHANICAL TRANSDUCER DEVICE" filed on May 6, 2011, the entirety of which are herein incorporated by reference.

FIELD OF THE INVENTION

This disclosure relates to methods of forming electromechanical transducer devices.

BACKGROUND OF THE INVENTION

ElectroMechanical Systems include Micro ElectroMechanical Systems (MEMS) structures and Nano ElectroMechanical systems (NEMS) and MEMS and NEMS structures are used in a wide variety of applications including, for example, MEMS accelerometers in cars for airbag deployment or in consumer electronic devices such as game controllers, MEMS gyroscopes used in cars to detect yaw, optical switching, bio-MEMS applications, MEMS loudspeakers, inkjet printers and RF MEMS components such as antenna phase shifters. Advantages of using MEMS structures include they have mechanical properties but have small dimensions and can be manufactured using existing semiconductor processing technologies.

A MEMS transducer device, which may be used as an actuator or sensor, may include a movable structure fabricated on a semiconductor substrate including at least one mechanical stack comprising one or more mechanical layers of a material such as silicon or silicon nitride and at least one functional/actuating stack whose function is to facilitate the movement of the mechanical stack on actuation of the device. The actuating stack comprises one or more layers whose arrangement and function in relation to the mechanical stack depends on the type of MEMS transducer device. For example, in an electrostatic actuated device, the actuating stack comprises a stationary electrode that cooperates with a movable electrode formed on a mechanical layer to facilitate movement of the mechanical layer and movable electrode. In a magnetic actuated device, the functional stack comprises a magnetic layer which is arranged to apply an external force to the movable mechanical stack in cooperation with an external magnet. The actuating stack can also be a multi-layered stack including at least one actuating layer of a material such as a piezoelectric or a magnetic material formed over a mechanical stack such as a mechanical beam or cantilever. Due to its electromechanical conversion properties, lead zirconate titanate ($Pb[Zr_xTi_{1-x}]O_3$ with $0<x<1$) which is generally known as PZT, is the most commonly used piezoelectric material in MEMS devices. In the case of a piezoelectrically actuated MEMS switch device such as that shown in FIG. 1, the multi-layer movable structure includes an actuating layer comprising a PZT film 2 formed over a cantilever or beam 4 (which may be a silicon nitride or a silicon oxide cantilever) and electrodes 6 and 8 (which may be platinum electrodes) formed on either side of the PZT film 2 for applying a voltage across the PZT film. Contacts 10 and 12 provide the switch contacts of the device. As is well known, by applying appropriate voltages across the PZT film, the PZT film expands or contracts depending on the applied voltage by piezoelectricity which applies stress to the cantilever and results in the cantilever being deflected orthogonally (in a direction perpendicular to the stack) to open or close the MEMS switch device.

An article entitled 'Design, fabrication and RF performances of two different types of piezoelectrically actuated Ohmic MEMS switches' by Hee-Chul Lee, Jae-Hyoung Park, Jae-Yeong Park, Hyo-Jin Nam and Jong-Uk Bu in Journal of Micromechanics and Microengineering 15 (2005), pages 21098-2104, describes a piezoelectric actuated RF MEMS switch having a PZT capacitor formed on a cantilever.

US patent application no. 2005/0127792 describes a multi-layered piezoelectric switch for tunable electronic components comprising multiple piezoelectric layers, and metal layers alternated with the piezoelectric layers on a cantilever. Thus, this device uses stacked piezoelectric capacitors to form a piezoelectric actuated switch.

For MEMs transducer devices having a movable structure with at least one free end (for example, clamped with a single anchor) and being composed of multi-layer materials stacked together, the deflection of the movable structure can vary with temperature change due to the different values of the Coefficient of Thermal Expansion (CTE) for the different materials which form the movable structure, as in a bimetallic strip. This is especially true for piezoelectric actuated transducers. For example, for the piezoelectric actuated transducer of FIG. 1, the layers including the platinum (Pt) electrode 6, PZT film 2, and the platinum (Pt) electrode 8 of FIG. 1 will have a CTE of approximately 9.5 ppm/° C. compared to a CTE of 2-3 ppm/° C. of the silicon nitride cantilever 4. Thus, when the operation temperature changes, the Pt/PZT/Pt layers will expand (or contract) differently than the silicon nitride cantilever which results in changes in the transducers orthogonal deflection and thus, its performance. For example, for operation temperature changes over a 120° C. range, the piezoelectric MEMS switch device of FIG. 1 can experience a total deflection excursion of 7 μm. With large changes in the transducers deflection, the device may be made inoperable: for example, in the MEMS switch device of FIG. 1, the deflection due to temperature variations may cause the switch to be opened when it should be closed.

The same effect is seen in electrostatic switch devices having a movable structure with at least one free end and composed of a movable mechanical stack and a movable electrode layer formed on the movable mechanical stack as part of the functional stack. The difference of the CTE of the materials of the two layers can produce a thermal induced actuation.

The deflection described for a movable structure with at least one free end is due to the bending effect of a mechanical moment or force due to the multi-layer stack. The mechanical moment or force is typically referred to as the bending moment. This bending moment can have the same effect on other movable structures, such as, for example, clamped structures where the bending moment, due to a multilayer stack, is not present along the full structure. Such clamped structures include transducer devices having a movable structure (such as a mechanical layer or membrane) which is supported or clamped at ends of the movable structure and an actuating structure (such as a piezoelectric, electrostrictive or magnetostrictive actuating stack) located at the ends or at the centre of the movable structure. The actuating structure has a bending effect or induces a bending moment on the movable structure which causes the movable structure to move. As with the free end movable structures described above, the bending moment induced in such clamped structures may also vary with temperature variations.

It is known to provide thermal compensation in electrostatic switch devices by having additional layers which are identical and symmetrical to the movable electrode so as to compensate for the thermal behaviour of the movable structure.

For example, U.S. Pat. No. 6,746,891 describes a tri-layered beam MEMS switch device which is actuated by an electrostatic charge. When a voltage is applied across a stationary electrode on a substrate and an opposing movable electrode on a movable beam, an equal and opposite charge is generated on the stationary electrode and movable electrode. The charge distribution on the opposing electrodes produces an electrostatic force that is balanced by the elastic forces on the now deformed beam. As the voltage is increased, the charge increases in a non-uniform and non-linear fashion across the surface of the beam until a stability point is reached. The stability point is defined by the inability of the elastic forces to maintain equilibrium with the electrostatic forces and the beam snaps through to establish contact between two switch contact pads. This patent describes how an electrode interconnect is formed on the beam, which electrode interconnect is a structural match or structurally similar to the movable electrode so as to provide robustness to film stress and temperature induced beam deformation. In one embodiment, this patent teaches that the electrode interconnect is fabricated of the same material and dimensioned the same in order to provide mechanical balance. It is assumed that the stress is the same in the additional layer and the movable electrode.

For the electrostatic actuated device, only one (movable) electrode layer, combined with a stationary electrode layer, is required for the device to function. Therefore, it is not too complex to use a symmetrical tri-layered structure to realize the thermal/stress balance. For a more complicated device having multiple layers, such as piezoelectric actuated device, at least three layers (electrode/PZT/electrode) form the functional/actuating stack and a mechanical beam layer forms the mechanical stack. This makes the thermal balance more difficult to be met. Theoretically, the same symmetrical approach as used in the electrostatic actuated device can be used in an attempt to achieve thermal balance: that is, the same three layers can be deposited on the opposite side of the mechanical beam layer. In reality, however, this is complicated by manufacturing process variations. More layers mean more processing steps and larger variations, resulting in higher cost and less reproducibility. Also, the presence of the PZT layer before mechanical beam deposition may not be allowed due to serious contamination concerns.

In view of process constraints, it is not always possible to put the same material on both sides of the mechanical stack, due to serious contamination problems or because of process conditions. For example, a metallic layer used as a compensation layer for a metal electrode on top of a mechanical layer and made before the mechanical layer may not be compatible with the temperature deposition of the material of the mechanical layer. Thus, even for an electrostatic actuated device, there is a need to propose a solution to have improved thermal stability without using a symmetrical movable structure.

In addition to thermal stresses causing unwanted deformation or deflection of the movable beam in a MEMS device with variations in operating temperature, residual thin film stresses in the different layers of the multi-layered MEMS device can also cause unwanted deformation or deflection. Thin film stresses arise from the deposition processes used to produce the layers of the multi-layered device.

For example, in the case of the piezoelectrically actuated MEMS switch device, such as that shown in FIG. 1, having an actuating structure comprising Pt/PZT/Pt layers formed over a silicon nitride beam 4, the PZT film 2 needs to be annealed for crystallization. As a result, the stresses of the Pt/PZT/Pt actuating layers are substantially controlled by the 600-700° C. anneal temperature which ensures good piezoelectric properties. For a silicon nitride beam 4 formed by Low Pressure Chemical Vapor Deposition (LPCVD), there is a limited range of stress attainability (300 MPa-1100 MPa) for the beam. Thus, provided the stress of the beam which is required to achieve stress balance falls within this range then, stress balance can be achieved. However, it is not always possible to achieve stress balance between the actuating layers and the beam in the vertical direction so as to realise a flat beam (i.e. zero deflection or deformation in the vertical direction). Residual stress can result in a deflection of micrometers or tens of micrometers at the tip of the beam. Achieving stress balance is more difficult with manufacturing steps requiring extreme temperatures.

An article entitled 'Mitigation of residual film stress deformation in multilayer microelectromechanical systems cantilever devices' by Jeffrey S. Pulskamp, Alma Wickenden, Ronald Polcawich, Brett Piekarski and Madan Dubey, in J. Vac. Sci. Technol. B 21(6), November/December 2003, pages 2482-2486 describes an approach to compensate for the residual thin film stress deformation in MEMS devices based upon analytical and numerical modelling and in-process thin film characterization. Using the equations which result from the modelling and detailed knowledge of the fabrication processes employed, the later deposition steps which possess the greater degrees of process control are used to form layers to compensate for the process variability in layer stress and thickness in the earlier processed films.

An article entitled 'Fabrication of PZT actuated cantilevers on silicon-on-insulator wafers for a RF microswitch' by Hong Wen Jiang, Paul Kirby and Qi Zhang in Micromachining and Microfabrication Process Technology VIII, San Jose Calif., USA 2003, pages 165 to 173, describes a processing scheme for fabricating PZT actuated silicon cantilevers using silicon-on-insulator wafers. A PZT actuating layer comprising a bottom titanium/platinum electrode, a PZT layer and a top Titanium/Gold electrode is formed on a silicon beam. A silicon dioxide interface layer is formed between the PZT actuating layer and the beam. Stress balancing is addressed during design of the device by determining the stress state of the layers that form the cantilever and choosing by calculation and appropriate adjustments in the deposition processes, the stress in the layers so as to attempt to balance stress across the cantilever and to obtain relatively flat cantilevers.

Even a basic MEMs device using a symmetric movable structure may not be stress balanced if the layers below and above the mechanical layer have different residual stresses due to different deposition conditions.

However, stress balancing during design is limited to the accuracy with which the mechanical parameters of the different layers can be measured and to the stability of the manufacturing processes.

SUMMARY OF THE INVENTION

The present invention provides a method of forming an electromechanical transducer device as described in the accompanying claims.

Specific embodiments of the invention are set forth in the dependent claims.

These and other aspects of the invention will be apparent from and elucidated with reference to the embodiments described hereinafter.

BRIEF DESCRIPTION OF THE DRAWINGS

Further details, aspects and embodiments of the invention will be described, by way of example only, with reference to the drawings in which:

FIGS. 6-10 are schematic cross-section diagrams of the part of the micro electromechanical transducer device of FIG. 2 during different stages of fabrication;

Elements in the figures are illustrated for simplicity and clarity and have not necessarily been drawn to scale.

DETAILED DESCRIPTION

In the description that follows and in some of the Figures, certain regions are identified as being of a particular material, and/or type. However, this is merely for convenience of explanation and not intended to be limiting. Those of skill in the art will understand based on the description given herein that various materials can be used and that the disclosure is not limited to the particular examples given in the description.

The present disclosure will be described with reference to a piezoelectric actuated MEMS switch device. However, it will be appreciated that the disclosure is not limited to piezoelectric actuated MEMS switch devices and applies equally to other MEMS transducer devices such as sensors, actuators, accelerometers, optical switches, varactors, variable inductors, phase shifters and magnetic or electrostatic actuated transducer devices and/or similar devices. Furthermore, the disclosure may also be used in Nano ElectroMechanical systems (NEMS) and thus is not limited to MEMS devices.

For the purpose of the disclosure, a transducer device is a device that converts one type of energy or physical attribute to another for various purposes including measurement, actuation or information transfer.

In addition, in the following description the different layers of the MEMS transducer device are described as having a certain position in the structure. However, it will be appreciated that the relative positions of the different layers are not limited to those described herein and may depend on the type of MEMS device and of the relative values of the CTE of the materials which form the layers.

Figure 1:
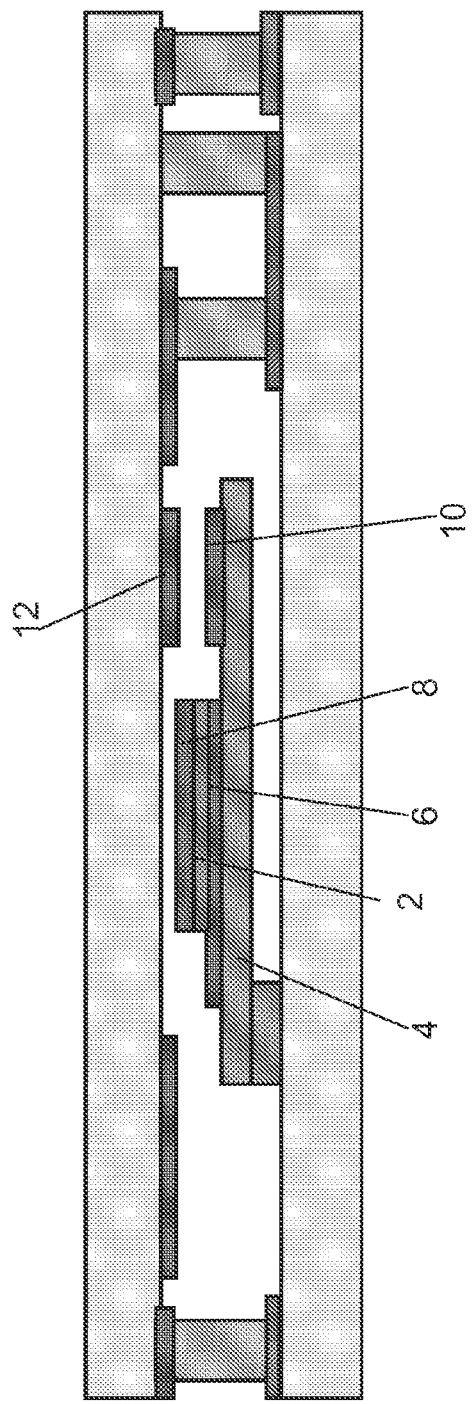
FIG. 1 is a schematic cross-section diagram of part of a typical piezoelectric MEMS switch device.
Figure 2:
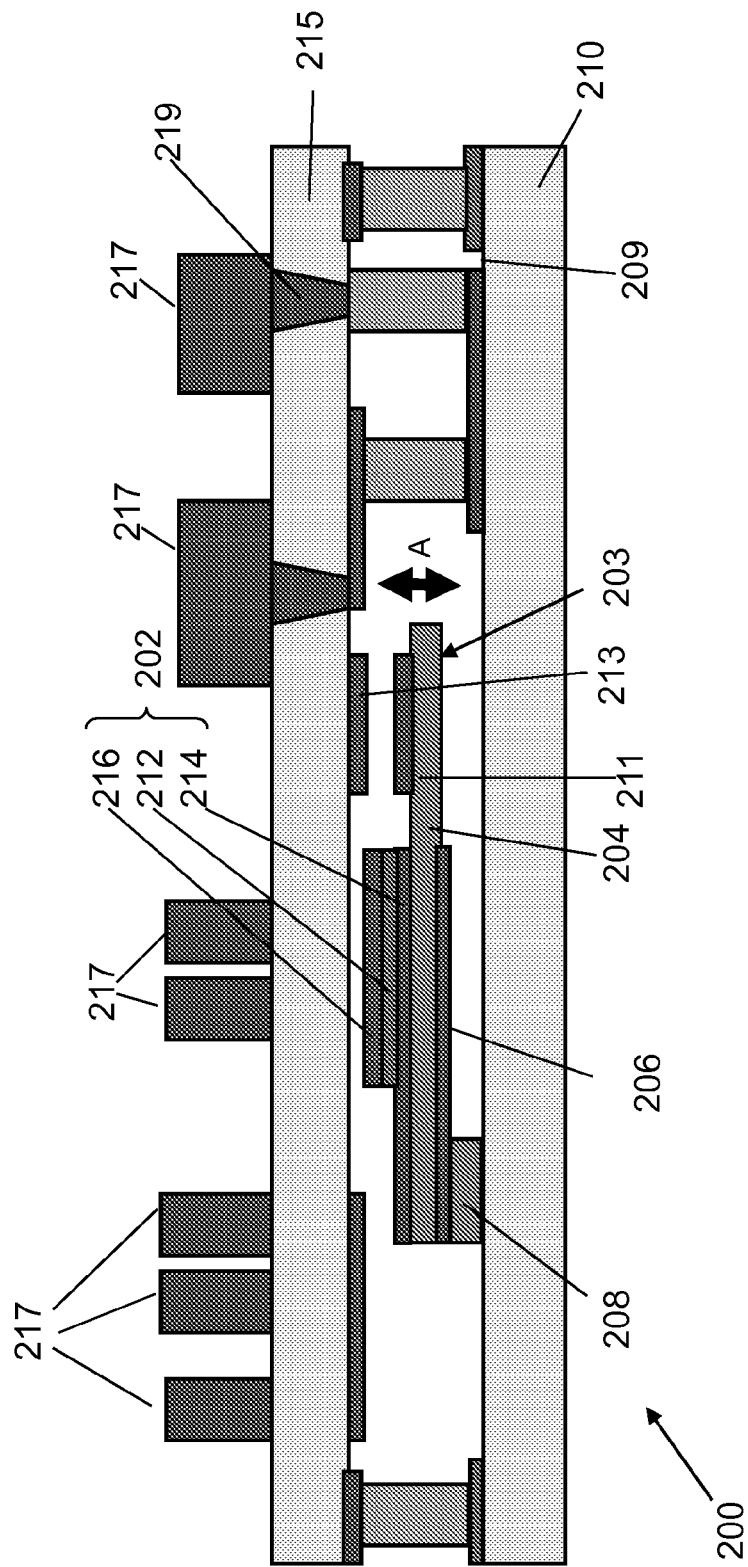
FIG. 2 is a schematic cross-section diagram of part of an electromechanical transducer device formed by an example method in accordance with an embodiment of the disclosure.

Referring now to FIG. 2, an example of a micro electromechanical switch (MEMS) device 200 formed by an example method in accordance with an embodiment of the disclosure comprises an actuating structure comprising a plurality of layers 202 including a piezoelectric layer 212, and a movable structure 203 which is arranged to be movable in response to actuation of the actuating structure in relation to a fixed structure of the MEMs device. For example, the movable structure 203 may be arranged to be movable in a direction (e.g. along line A shown in FIG. 2) which direction is substantially perpendicular to a main plane of the layers 202 of the actuating structure and movable structure 203. The movable structure 203, in the example shown in FIG. 2, includes the plurality of actuating layers 202 of the actuating structure, a mechanical layer or beam 204 and a temperature (or thermal) compensation layer 206 and is movable with respect to a fixed structure which includes a substrate 210. It will be appreciated that in other MEMS devices, the actuating structure may comprise at least one layer as part of the movable structure and at least one layer which is not part of the movable structure and is part of the fixed structure: e.g. an electrostatic actuated device may comprise an actuating structure having a movable electrode formed as part of the movable structure and also a stationary electrode formed on a substrate and as part of the fixed structure. Due to process requirements, the movable structure may further comprise additional thin layers, such as for example, seed layers or buffer layers. In the example shown in FIG. 2, the beam 204 is a cantilever supported by an anchor 208 which is formed on a substrate 210. The anchor can be at one end of the structure as shown in the drawing or at a different place. The movable structure 203 has at least one free end. The beam 204 is arranged to be movable by the actuating structure in response to piezoelectric actuation of the actuating structure, for example, by applying appropriate voltages across the piezoelectric layer 212 via the layers 216 and 214 which form the electrodes of the actuating structure.

The MEMS switch device 200 further comprises contacts 211 and 213 which provide the switch contacts of the device 200. In the example shown in FIG. 2, one switch contact 211 is formed on the movable structure 203 and the other switch contact 213 is formed above the movable switch contact 211. Alternatively, the other switch contact may be formed on the substrate 210.

A passivation layer 215 is formed over the movable structure 203 and actuating structure and metal contacts 217 are formed on the passivation layer by patterning and removing portions of a final metal layer formed on the passivation layer. Vias or openings 219 filled with conductive material facilitate the electrical coupling of the metal contacts 217 to parts of the MEMS switch device 200, such as to the switch contacts 213, 211, to the electrodes 216 and 214, of the MEMS switch device 200.

It will be appreciated that the MEMS switch device 200 may include other elements but these other elements are not shown for simplicity.

In a magnetic actuated MEMS device, the actuating structure includes a magnetic layer instead of a piezoelectric layer formed as part of the movable structure 203.

The thermal response characteristic of a layer depends on the CTE of the material(s) that makes up the layer. When a layer is added to a structure, the layer produces a thermal effect and the thermal effect of such a layer depends on parameters such as the CTE and Young's Modulus of the material(s) that makes up the layer and on the thickness of the layer. In the example shown in FIG. 2, the actuating layers 202 of the actuating structure have a different thermal response characteristic to that of the beam 204. A result of having different thermal response characteristics is that the thermal effect produced by the actuating layers 202 formed on the mechanical layer 204 leads to the movement or deflection of the movable structure 203 with variations in temperature. Thus, in the example shown in FIG. 2, the thermal compensation layer 206 is designed so that its thermal effect when added to the movable structure 203 balances or compensates the thermal effect produced by the mechanical layer and the actuating layers 202 such that the movement of the beam 204 is substantially independent of variations in temperature.

The thermal compensation layer 206 may be different to the actuating layers in structure/configuration: in other words, the thermal compensation layer 206 may not be symmetric to the actuating layers 202. For example, the thermal compensation layer 206 may comprise one or two layers only compared to a three-layered actuating structure as shown in FIG. 2 or the thermal compensation layer 206 may comprise a compensation layer formed of material different to that of the actuating layers 202 of the actuating structure. Alternatively, the thermal compensation layer 206 may be the same as the actuating layers: in other words, the thermal compensation layer 206 may be symmetric to the actuating layers 202 and in the example shown in FIG. 2, comprise three layers which are substantially the same as the actuating layers 202.

Since the thermal effect of a layer depends on parameters such as the CTE and Young's Modulus of the material(s) that makes up the layer, its position in relation to the other layers and on the thickness of the layer, the thermal compensation layer 206 is arranged to have a thermal effect which compensates or balances the thermal effect produced by the mechanical layer 204 and the at least one layer 202 of the actuating structure by, for example, in the case of the thermal compensation layer 206 being different to the actuating layers, selecting a material for the thermal compensation layer according to 'intrinsic' parameters such as the CTE, and Young's modulus of the material, and by arranging for the thermal compensation layer 206 to have an appropriate thickness in order to provide the desired compensation.

In the example shown in FIG. 2, the thermal compensation layer 206 and the actuating layers 202 are formed on opposite sides of the beam 204. In this example, the thermal compensation layer 206 is designed so that its CTE is substantially the same as the CTE of the actuating layer 202. Alternatively, the thermal compensation layer 206 may be formed on the same side of the beam 204 as the actuating layers 202.

FIG. 2 also shows the actuating layers 202 being formed on top of the beam 204. It will be appreciated that alternatively, the actuating layers 202 may be formed under the beam 204 with the thermal compensation layer 206 being formed on the opposite side of the beam 204 or on the same side of the beam 204 as the actuating layers 202 as discussed above.

The choice of the CTE of the thermal compensation layer 206 depends on a thickness 220 of the thermal compensation layer and also depends on the material used to form the compensation layer 206. In other words, for a given material for the compensation layer 206, its thickness and its position on the movable structure 203 (e.g. same side of the beam as the actuating layers or on opposite sides) depends on the CTE and the Young's Modulus value of the material.

The thickness and position of the thermal compensation layer can be derived from finite element simulations or analytical analysis.

Figure 3:
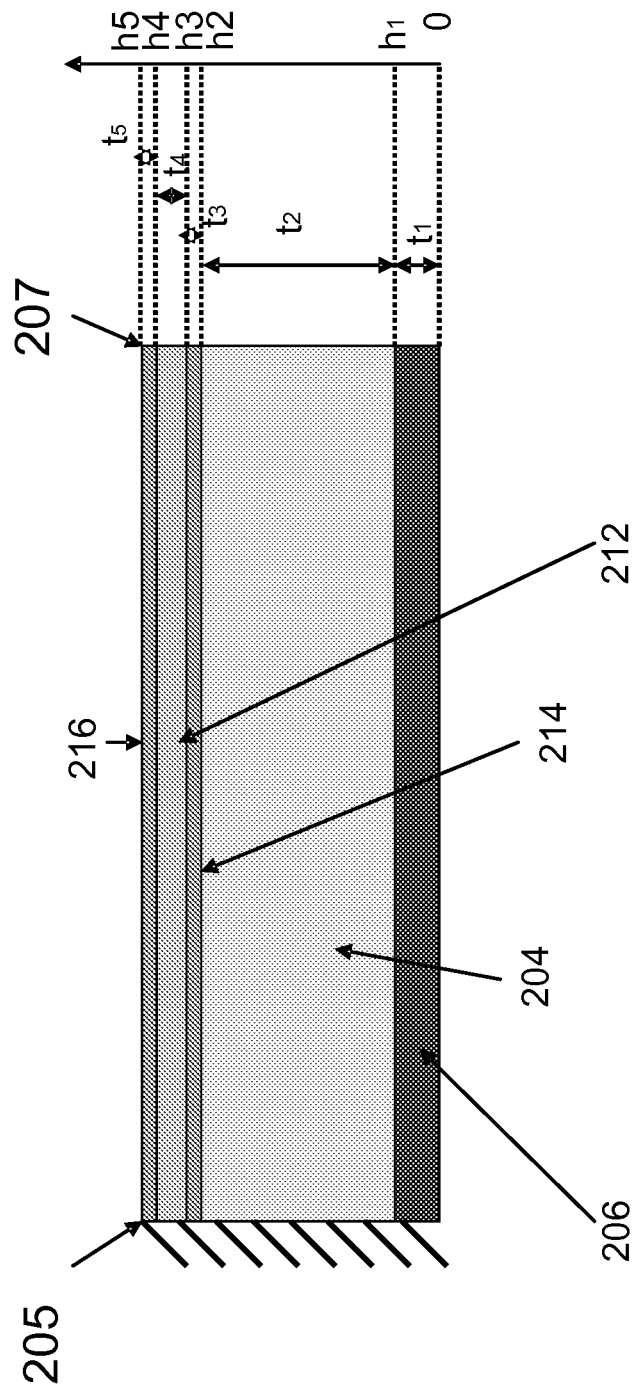
FIG. 3 is a schematic cross-section diagram of the movable structure of FIG. 2 showing the parameters used to calculate the deflection of the movable structure.

The full mathematical description of the deflection of a free-clamped cantilever beam made of a multilayer can be derived from an article by C. H. Hsueh, Thermal stresses in elastic multilayer systems, Thin Solid Films 418 (2002) 182-188. FIG. 3 shows the multilayer movable structure or cantilever shown in FIG. 2 with the parameters used in the mathematical description and having a clamped end 205 and a free end 207.

According to these parameters and based on the publication of Hsueh, one can obtain the deflection δ of the free end 207 of the cantilever due to the thermal effect as:

$$\delta = \frac{3L^2}{2} \frac{\sum_i E_i t_i (c - \alpha_i \Delta T)(2h_{i-1} + t_i)}{\sum_i E_i t_i [6h_{i-1}^2 + 6h_{i-1}t_i + 2t_i^2 - 3t_b(2h_{i-1} + t_i)]} \quad \text{Equation 1}$$

$$\text{With } c = \frac{\sum_i (E_i t_i \alpha_i \Delta T)}{\sum_i E_i t_i} \text{ and } t_b = \frac{\sum_i E_i t_i (2h_{i-1} + t_i)}{2\sum_i E_i t_i}$$

Where:
Ei is the Young's modulus of layer i;
ti is the thickness of layer i;
L is the length of the actuator;
αi is the CTE of layer i;
hi is the distance between the top of layer i and the bottom of the stack used as origin (note that h0=0);
ΔT is the difference between the working temperature experienced by the device and the reference temperature (typically 25° C.).

In order to compensate (at least partially) the thermal effect and provide a zero degree deflection, the goal is to choose a material and thickness for the compensation layer 206 which induces δ=0 whatever ΔT. According to equation 1 and the value of c, the following equation can be derived first for the deflection of the beam:

$$\delta_T = \frac{-6 \cdot L^2 \cdot \sum_i \sum_{j>i} d_{ij} \cdot E_i \cdot E_j \cdot t_i \cdot t_j (\alpha_j - \alpha_i) \cdot z_{ij}}{\sum_i E_i^2 \cdot t_i^4 + \sum_i \sum_{j>i} E_i \cdot E_j \cdot t_i \cdot t_j \cdot (12 d_{ij}^2 + t_i^2 + t_j^2)} \Delta T_0 \quad \text{Equation 2}$$

where:
$\delta_T$ represents the deflection variation of the beam over the full operational
temperature range and which is positive for an upward deflection;
dij is the distance between layers i and j, measured from the middle of the layers;
ΔT0 is the full operational temperature range of the device; and
zij is equal to 1 when layer j is above layer i and equals to −1 when layer j is below layer i.

The condition to remove the thermal effect may then be described as:

$$m_T = \sum_i \sum_{j>i} d_{ij} \cdot E_i \cdot E_j \cdot t_i \cdot t_j (\alpha_i - \alpha_j) \cdot z_{ij} \cdot \Delta T_0 \quad \text{Equation 3a}$$

$$m_T = 0$$

The deflection described by Equation 2 is due to a bending moment acting on the beam which is proportional to the value of $m_T$ (thermal bending moment) given by Equation 3a. When $m_T=0$, there is no bending moment and so there is no deflection. Thus, by solving equation 3a for $m_T=0$, a suitable thickness for the compensation layer 206 may be determined.

Figure 14:
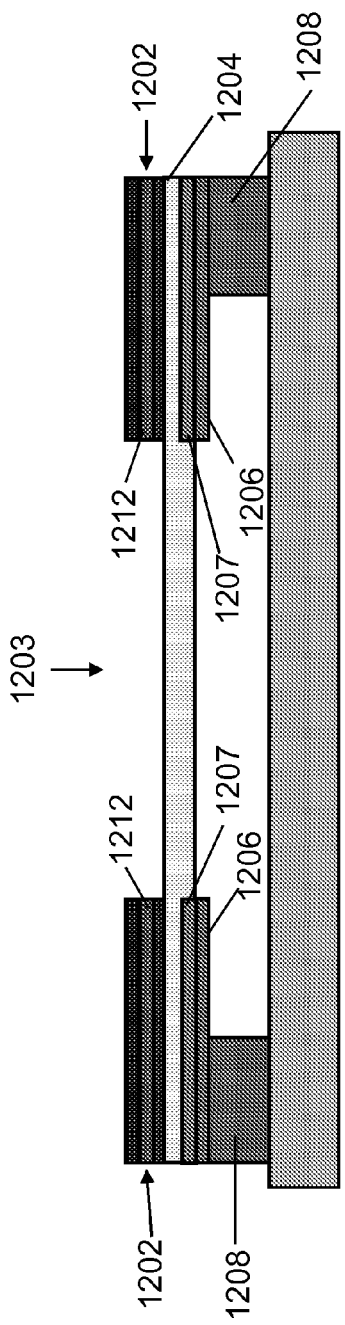
FIG. 14 is a schematic cross-section diagram of part of an example of a micro electromechanical transducer device in accordance with another embodiment of the disclosure.
Figure 15:
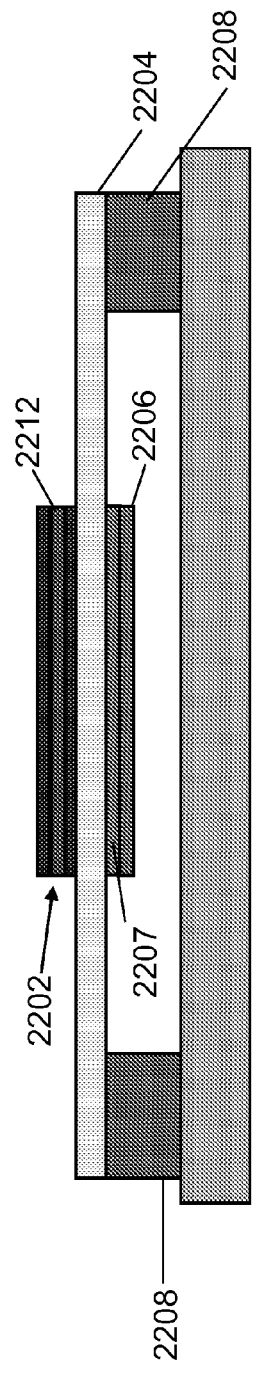
FIG. 15 is a schematic cross-section diagram of part of an example of a micro electromechanical transducer device in accordance with another embodiment of the disclosure.

Although the disclosure describes reducing the thermal effect for a beam structure having a free end (as shown in FIG. 2), it will be appreciated that the disclosure may also be applied to other structures sensitive to a bending moment, such as the clamped structures shown in FIGS. 14 and 15, where the bending moment may also be proportional to $m_T$ given by Equation 3a. In the embodiments disclosed in FIGS. 14 and 15, the device comprises a movable structure 1203, 2203 supported or clamped at ends by an anchor 1208, 2208 with at least one layer 1202, 2202 of the actuating structure formed on a portion of the movable structure 1203. 2203. The at least one layer may be formed on a top surface of the movable structure or on a bottom surface of the movable structure 1203, 2203. FIG. 14 shows that the at least one layer of the actuating structure is formed in substantially a central portion of the movable structure and on a top surface of the movable structure and FIG. 15 shows that the at least one layer of the actuating structure is formed on end portions of the movable structure and on a top surface of the movable structure. First 1206, 2206 and second 1207, 2207 compensation layers are located with the at least one layer of the actuating structure. The actuating structure may be a piezoelectric, electrostrictive or magnetostrictive structure.

For these kind of transducer devices, it is known that the actuation of the device may be equivalent to a variation of stress (called actuating stress) $\sigma^A$ in an actuating layer. For example, for a piezoelectric actuating layer, it is known that $$\frac{\sigma^A}{E} = \frac{d_{31} V}{T_A}$$

where d31 is the piezoelectric coefficient, V is the voltage applied to the piezoelectric actuating layer, E is the Young's modulus of the layer and $T_A$ is the thickness of the actuating layer.

For a multilayered structure defined by equivalent actuating stress in each layer (eventually equal to 0), the actuating bending moment is then proportional to $m_A$:

$$m_A = \sum_i \sum_{j>i} d_{ij} \cdot E_i \cdot E_j \cdot t_i \cdot t_j \left( \frac{\sigma_j^A}{E_j} - \frac{\sigma_i^A}{E_i} \right) \cdot z_{ij} = 0 \quad \text{Equation 3b}$$

In an example, the thermal compensation provided by the thermal compensation structure may be designed so that the ratio between $m_T$ and $m_A$ is small enough to avoid thermal actuation when compared to the regular actuation (e.g. due to applying a voltage to a piezoelectric actuating layer). For example, the material and thicknesses of the layers may be chosen so that $m_T/m_A$ is less than 50%. In other words, in an example embodiment, a range for the thickness of the compensation layer can be obtained by solving equation 3a and then by using the condition on the ratio between $m_T$ and $m_A$ given above or some percentage (say 10%) of the solution to equation 3a.

FIG. 14 shows a MEMS device 1000 in accordance with another embodiment of the disclosure comprising a movable structure 1203 which is arranged to be movable in response to actuation of an actuating structure. The movable structure 1203 includes a mechanical structure 1204 comprising a mechanical layer or membrane 1204 supported at ends of the mechanical layer 1204 by anchors 1208. The actuating structure comprises a plurality of layers 1202, including a piezoelectric layer 1212, formed at the ends of the mechanical layer 1204. First 1206 and second 1207 compensation layers are provided at the ends of the mechanical layer 1204 with the layers of the actuating structure to facilitate compensation of the thermal and/or stress effects in the MEMs device 1000. Like components to those of FIG. 2 are referred to by the same reference numeral plus the number 1000.

FIG. 15 shows a MEMS device 2000 in accordance with another embodiment of the disclosure comprising a movable structure 2203 which is arranged to be movable in response to actuation of an actuating structure. The movable structure 2203 includes a mechanical structure 2204 comprising a mechanical layer or membrane 2204 supported at ends of the mechanical layer 2204 by anchors 2208. The actuating structure comprises a plurality of layers 2202, including a piezoelectric layer 2212, formed at substantially the centre of the mechanical layer 2204. First 1206 and second 1207 compensation layers are provided at substantially the centre of the mechanical layer 2204 with the layers of the actuating structure to facilitate compensation of the thermal and/or stress effects in the MEMs device 2000. Like components to those of FIG. 2 are referred to by the same reference numeral plus the number 2000.

As Ei, αi, ti, hi are known for all the materials involved in the multilayer movable structure 203, theoretically, many different materials which are technologically compatible with the manufacturing processes used to form the multilayer movable structure can be chosen for compensating thermally the movable structure. Indeed, if one chooses a material for compensation, E and α are known for this material and the last unknown is a suitable thickness t of this layer which can be determined by solving equation 3a. However, in some cases, the resolution of equation 3a can induce a negative thickness which means that there is no solution.

Equation 3a defines the targeted specifications for the compensation layer 206 for when the goal for the deflection of the movable structure is to be independent of temperature. For each application of the MEMS device, it is possible, starting from the product specifications, to define a maximum acceptable deflection variation δm over a temperature range: that is, the deflection amount due to temperature variations may be non-zero. For example, for a RF MEMS switch for the OFF state, δm will be defined to maintain the isolation characteristics of the switch for the OFF state, and so that the theoretical deflection for the ON state is always higher than the gap. In general, for an actuator defined by its maximum deflection variation δa between ON and OFF state at room temperature, δm can be defined as a fraction of δa, for example 50%.

Equation 2 can be used in this case to define a range of possible values for the specifications of the compensation layer 206 by targeting a value of δT lower than δm.

A first way to simplify equation 2 is to make an assumption that the thickness of the layer called "the thermal compensation layer 206" is small at least when compared to some of the other layers. More precisely, it is assumed that, choosing n for the numbering of the thermal compensation layer, equation 2 can be approximated by $$\delta_T = \frac{-6 \cdot L^2 \cdot \left[ \sum_{i \neq N} \sum_{N > j > i} d_{ij}^* \cdot E_i \cdot E_j \cdot t_i \cdot t_j (\alpha_j - \alpha_i) \cdot z_{ij} + \atop t_N \cdot \sum_{i \neq N} d_{iN}^* \cdot E_i \cdot E_N \cdot t_i (\alpha_N - \alpha_i) \cdot z_{iN} \right]}{\sum_{i \neq N} E_i^2 \cdot t_i^4 + \sum_{i \neq N} \sum_{N > j > i} E_i \cdot E_j \cdot t_i \cdot t_j \cdot (12 d_{ij}^{*2} + t_i^2 + t_j^2)} \Delta T_0 \quad \text{Equation 4}$$

Where: $d_{ij}^*$ is the distance between the layers i and j without taking into account the thickness of layer N.

The thickness of the thermal compensation layer is then given by $$t_N = \frac{-\sum_{i \neq N} \sum_{N > j > i} d_{ij}^* \cdot E_i \cdot E_j \cdot t_i \cdot t_j (\alpha_j - \alpha_i) \cdot z_{ij}}{\sum_{i \neq N} d_{iN}^* \cdot E_i \cdot E_N \cdot t_i \cdot (\alpha_N - \alpha_i) \cdot z_{iN}} \quad \text{Equation 5}$$

In order to ensure that the thickness given by equation 5 is positive, the position of layer N on the stack downward or upward can be moved to provide a solution with a positive value since the sign of the denominator of Equation 5 takes two opposite values when layer N moves from the top of the stack ($z_{Ni}$ always positive) to the bottom of the stack ($z_{Ni}$ always negative).

In order for a value given by equation 5 for the thickness of the compensation layer to be an acceptable solution, the value cannot be too high so as to avoid having very thick thermal compensation layers. Thus, in order to provide a small value for $t_N$, it is better to choose a thermal compensation layer which has a thermal characteristic as different as possible to the thermal characteristic of the thicker layers.

Figure 13:
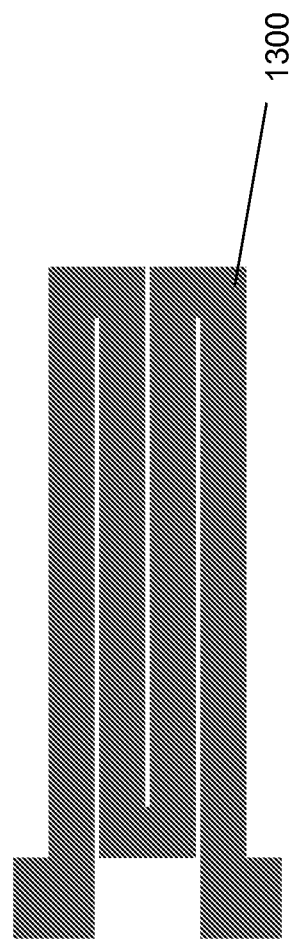
FIG. 13 is a top plan schematic view of an example layout design of a heater for an electromechanical transducer device in accordance with an embodiment of the disclosure.

Another way to simplify this equation 2 is to make the assumption that the thickness of all the layers are small compared to one layer. In a practical example, the one layer is called the mechanical layer 204. With this assumption, equations 2 and 3a can be approximated as $$\delta_T = \frac{-3L^2}{E_0 \cdot t_0^2} \sum_{i \neq 0} \cdot E_i \cdot \bar{t}_i \cdot (\alpha_i - \alpha_0) \quad \text{Equation 6a}$$

$$\sum_{i \neq 0} \cdot E_i \cdot \bar{t}_i \cdot (\alpha_0 - \alpha_i) = 0 \quad \text{Equation 6b}$$

where:

i=0 is the thickest mechanical layer having a thickness $t_0$, $\bar{t}_i$ is the algebraic thickness, positive on top of the mechanical layer and negative below the mechanical layer as shown for example in FIG. 13 where $\bar{t}_4 = -t_4$, and $\bar{t}_3 = t_3$.

In this case, starting from a given material for all the layers 1 to n−1 (except one noted n), there is always a given algebraic thickness (so thickness and position (top or bottom)) for the nth layer given by the equation:

$$\bar{t}_n = \frac{\sum_{i=1}^{n-1} E_i \bar{t}_i (\alpha_i - \alpha_0)}{E_n (\alpha_0 - \alpha_n)} \quad \text{Equation 7}$$

Depending on the value of CTE, the position of the compensation layer 206 can be on the side of the actuating layers 202 or on the opposite side. The algebraic thickness of the compensation layer 206 is not only dependent on CTE but depends also on the value of the Young's modulus of the material used for the compensation layer 206. In order to avoid having only a compensation layer which exhibits a second order thermal effect, a compensation layer 206 with a CTE different from the CTE of the mechanical layer 204 may be used.

Equations 5 or 7 can be used to find a first set of parameters for an approximated solution. This first set can then be adjusted by using equation 4 or a finite element simulation.

Once again, equation 5 and 7 give the targeted thickness for the compensation layer 206 and equation 6a can be used to define a range of acceptable values when comparing δ0 to δm.

Examples of materials suitable for a compensation layer 206 with a SiN mechanical layer or beam 204 (having a CTE=2.1 ppm/° C.), include: TiN, Pt, WSi (all having a CTE around 9 ppm/° C.).

In an example, the actuating layers 202 may comprise at least one piezoelectric capacitor including a piezoelectric layer 212 formed between first 214 and second 216 electrodes. The actuating layers 202 may alternatively include a plurality of piezoelectric capacitors stacked as in the arrangement disclosed in US patent application publication no. 2005/0127792, incorporated herein by reference. In an example, the piezoelectric layer 212 may be formed from PZT material and thus comprises a PZT layer 212 and the first 214 and second 216 electrodes are platinum electrodes. With the actuating layers 202 comprising Pt/PZT/Pt layers, the thermal compensation layer 206 may comprise a platinum layer, a titanium nitride layer, tungsten silicon layer, titanium tungsten layer, titanium, tungsten nitride layer, tungsten nitride layer or other layer of similar material or one or two layers of any combinations of these materials in order for the CTE of the thermal compensation layer 206 to thermally compensate for the actuating layers 202. For the example having a titanium nitride thermal compensation layer 206, the titanium nitride thermal compensation layer 206 has a CTE of approximately 8-9 ppm/° C., the Pt/PZT/PT actuating layers have a CTE of 9.5 ppm/° C. and the beam 204 being formed of silicon oxide has a CTE of 2-3 ppm/° C. and thus, thermal balance can be achieved.

Figure 4:
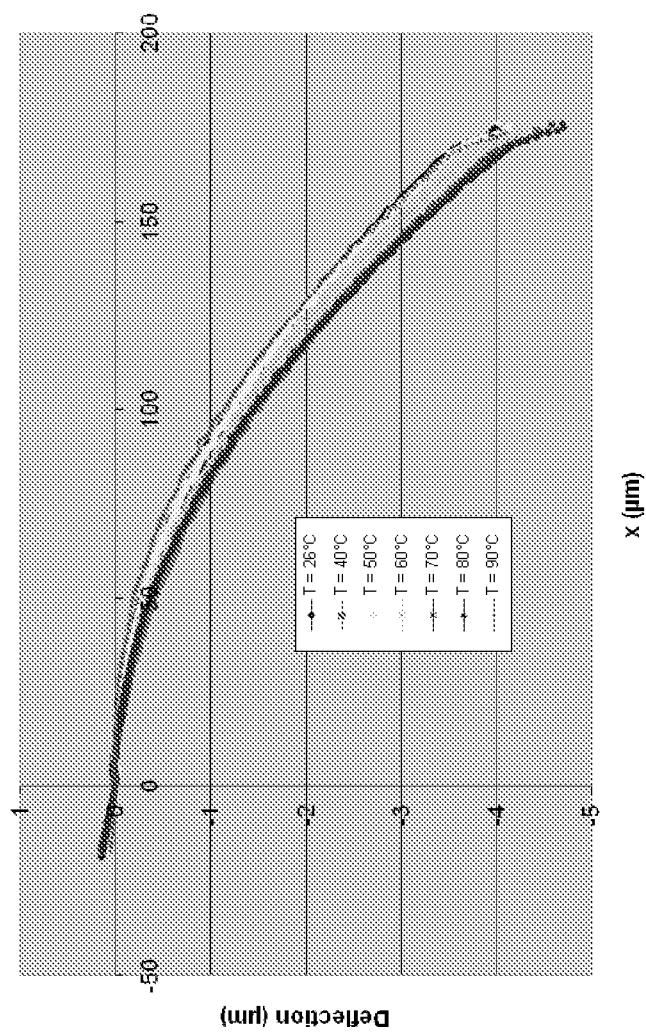
FIG. 4 is a graphical representation of the variation in the deflection of a PZT actuated beam as shown in FIG. 2 at different operating temperatures with different stress compensation layers.

FIG. 4 is a graph showing the variation in the deflection of a PZT actuated beam as shown in FIG. 2 when the MEMS switch device 200 is in an off state (or on release) at different operating temperatures ranging from 25° to 90° across the length of the beam with a titanium nitride thermal compensation layer 206 and a silicon oxide beam 204. As can be seen from the graph, there is little variation in deflection (<0.5 µm) with the operating temperature ranging from 25° to 90° due to the balancing of the thermal effects across the different layers of the movable structure 203. In FIG. 4, X=0 corresponds to the clamped end 205 of the beam 204.

As discussed in the introduction, in addition to thermal stresses causing unwanted deformation or deflection of the movable beam in a MEMS device with variations in operating temperature, stresses in the different layers of the multi-layered MEMS device can also cause unwanted deformation or deflection. The plurality of layers 202 of the actuating structure have a different stress response characteristic to that of the beam 204. The stress response characteristic of a layer depends on the Young's Modulus of the material(s) that makes up the layer and the residual stress or strain defined by reference to a substrate on which the layer is formed. When a layer is added to a structure, the layer produces a stress effect and the stress effect of such a layer depends on parameters such as the residual stress, Young's Modulus of the material(s) that makes up the layer and on the thickness of the structure's layer(s). The stress effect produced by the plurality of layers 202 of the actuating structure formed on the mechanical layer 204 and having different stress response characteristics leads to the movable structure 203 being moved or deflected by an amount relative to a plane parallel to a surface of the substrate 210 on release of the device and when the device is in an off or inactive state (e.g. when the actuating structure is not actuated which may be with no applied voltage) which may not be within a targeted or desired range of deflection.

Typically and as discussed in the introduction, stress balancing may be addressed during design of the MEMS device structure. Examples are described in the above referenced articles. However, the resulting MEMS device on release may still have a deflection that is not within a targeted or desired range due to the limited accuracy used to measure the mechanical parameters of the different layers and/or the manufacturing process variations. Thus, the initial deflection shown in FIG. 4 can be outside of a desired range if the residual stress of the layers of the device is not balanced properly.

For a clamped structure, such as that shown in FIG. 14 or 15, the average value of the stress induces a change in the elasticity of the structure. This is a second order effect on the deflection when compared to the effect of the stress gradient due to the different layers of the multilayered structure and thermal effects, especially if the mechanical structure has a CTE close to the substrate (which is the case when the substrate is a silicon substrate and the beam is formed of silicon nitride).

An example of a method of forming an electromechanical transducer device in accordance with an embodiment of the present disclosure will now be described with reference to FIGS. 2, 5-13 in which only part of the transducer device is shown, for simplicity. In the following example, in addition to stress adjustments performed by design e.g. by selecting appropriate thicknesses and materials for the different layers and processing parameters, an additional fine adjustment or trimming of the stress is performed in order to improve the accuracy of the deflection of the movable structure.

Figure 5:
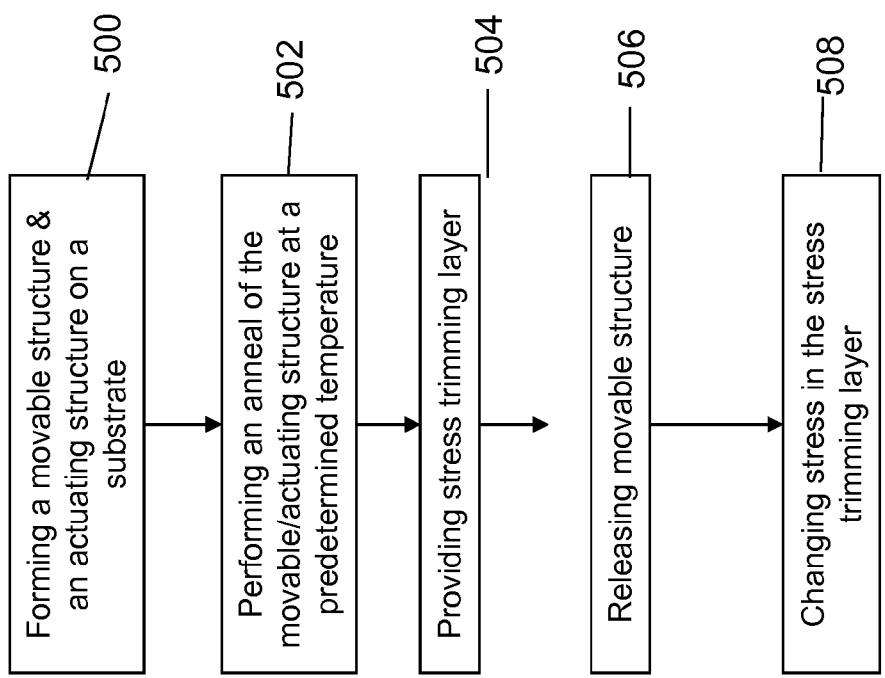
FIG. 5 is a simplified flow diagram of an example method of forming an electromechanical transducer device in accordance with an embodiment of the disclosure.
Figure 6:
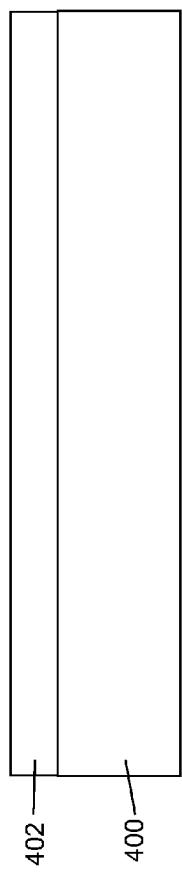

As shown in FIG. 5, step 500 and in FIG. 6, a semiconductor substrate 400 is provided and a movable structure 203 and an actuating structure of the MEMS switch device 200 are formed on the substrate 400. The semiconductor substrate described herein can be any semiconductor material or combinations of materials, such as gallium nitride, silicon carbide, silicon-on-insulator (SOI), silicon, monocrystalline silicon, the like, and combinations of the above. A sacrificial layer 402 is formed over the semiconductor substrate 400. The sacrificial layer 402 is, for example, a 1 μm thick amorphous silicon layer which may be deposited using Plasma Enhanced Chemical Vapor Deposition PECVD. The thickness of the sacrificial layer 402 determines the height of the air gap between the thermal compensation layer 206 (of FIG. 2) and the substrate 400 (210 of FIG. 2). The sacrificial layer 402 may be formed from other materials such as silicon, polysilicon, silicon dioxide.

Figure 7:
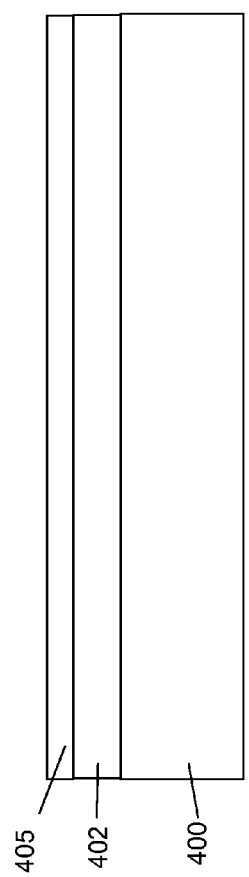
Figure 8:
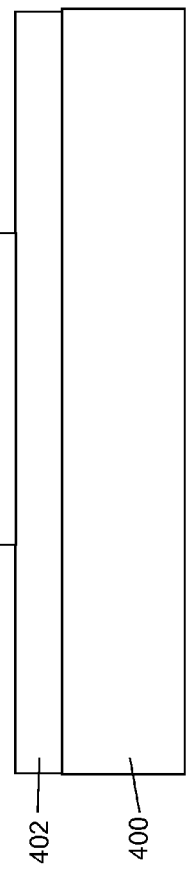

A layer 405 is then deposited over the sacrificial layer 402 as shown in FIG. 7. Layer 405 is then patterned and etched to form the thermal compensation layer 206 (of FIG. 2). In the embodiment shown, the layer 405 is a single layer of titanium nitride deposited by Physical Vapor Deposition (PVD) which forms a single layer thermal compensation layer 206 having a thickness of 10 nm-300 nm. Other materials which may be used for the thermal compensation layer 206 include platinum, titanium nitride, tungsten silicon, titanium tungsten, titanium, tungsten nitride, tungsten nitride or other similar materials or any combinations thereof. In the case of the thermal compensation layer 206 comprising more than one layer, then the other layers would be deposited, patterned and etched at this stage. The number of layers and the type of material(s) used for the one or more layers and the thickness of the layers are selected according to the desired thermal effect which compensates or balances the thermal effect of the beam 204 and the actuating layers 202 and thus, may be selected depending on the thickness and the thermal response characteristic of each of the beam 204 and the actuating layer 202.

A layer 408 is then deposited over the sacrificial layer 402, and the thermal compensation layer 206, as shown in FIG. 9. The layer 408 is then patterned and etched to form the beam 204 which will provide support and mechanical strength to the final released structure. In an embodiment, the layer 408 is a silicon nitride layer which is deposited using PECVD. However, other materials may be used instead for layer 408 such as silicon dioxide or silicon/oxide/nitride, silicon, polysilicon, aluminium nitride or similar dielectric materials. The layer 408 can be patterned at this stage or later depending on the etch method used for the piezoelectric layer 212 of FIG. 10. For example, should the piezoelectric layer 212 of FIG. 10 be etched through a dry etch process, the layer 408 can be patterned at this stage. Should the piezoelectric layer 212 of FIG. 10 be etched by means of a wet etch process, the layer 408 is patterned at a later stage so that it may serve to protect the underlying sacrificial layer 402 from the etching chemicals.

As shown in FIG. 10, the first electrode 214 is then formed on the layer 408. For example, the first electrode 214 is formed using sputter deposition and a lift-off process which is well known in the art. In an embodiment, the first electrode 214 is a platinum electrode having a thickness of 50 nm to 500 nm. In another embodiment, the first electrode 214 may be formed from ruthenium oxide, iridium, iridium oxide, ruthenium, ruthenium dioxide, gold, copper or other suitable metal.

A piezoelectric layer 212 is then formed over the first electrode 214. The piezoelectric layer 212 is, for example, formed from a PZT layer having a thickness of 50 nm to 3 μm, deposited using, for example, a sol-gel deposition process and then patterned and etched using a variety of dry or wet etch techniques. Alternative materials for the piezoelectric layer 212 include zinc oxide, aluminium nitride, PLZT, PMNT or similar materials.

The thermal compensation layer 206 and the Pt/PZT/Pt layers 202 are arranged to have the same coverage areas over the surfaces of the beam 204. Photolithography may be used to align the different layers.

Although not shown, additional piezoelectric layers may then be formed so as to provide a structure having several stacked piezoelectric capacitors.

It will be appreciated that, although not shown and described, at least one anchor 208 will be formed during the formation of the MEMS switch device 200 to support the movable structure 203 on the substrate 210.

In the example method shown in FIG. 5, the partly formed multi-layered structure including the movable structure 203 and the actuating structure formed on the substrate 210 (400) is then annealed according to an anneal parameter having a predetermined value. The anneal parameter may be temperature or time or a combination of temperature and time. In an example and in the following, the anneal parameter used is temperature and thus, the movable structure 203 and the actuating structure formed on the substrate 210 (400) is annealed at an anneal temperature having a predetermined value, step 502 in FIG. 5. The predetermined value of this first anneal may be chosen so as to stabilise the stress level in the layers of the partly formed MEMS switch device. In an example MEMS switch device having a PZT piezoelectric layer 212, the predetermined value is selected to ensure the crystallisation of the PZT piezoelectric layer 212 and so is in the range of 600-750° C.

The second electrode 216 is then formed on the layer piezoelectric layer 212. For example, the second electrode 216 is formed using sputter deposition and a lift-off process which is well known in the art. In an embodiment, the second electrode 216 is also a platinum electrode having a thickness of 50 nm to 500 nm. In another embodiment, the second electrode 214 may be formed from ruthenium oxide, iridium, iridium oxide, ruthenium, ruthenium dioxide, gold, copper or other suitable metal. The second electrode 216 may be formed from the same metal or a different metal as the first electrode 214.

A stress trimming layer is formed on the movable structure 203, step 504 in FIG. 5. In the example shown and described herein, the stress trimming layer is the second electrode 216 and thus is formed as described above. In an alternative example, an additional layer may be formed over the second electrode 216 to provide a stress trimming layer and may be formed during final device processing steps before the movable structure 203 is released. In this case, the second electrode 216 may then be formed prior to the first anneal. In the following, forming one stress trimming layer is described but it will be appreciated that more than one stress trimming layer may be formed.

The movable structure 203 is then released (step 506 in FIG. 5) during final device processing steps. These final device processing steps may also include the deposition of an additional metal layer (not shown). This layer is patterned and portions of the final metal layer removed to form contacts to parts of the MEMS switch device 200, such as to the switch contacts 213, 211, to the electrodes 216 and 214, of the MEMS switch device 200. This additional metal layer may be formed, for example, using sputter deposition and a lift-off process which is well known in the art. The final metal layer may be formed from platinum, ruthenium oxide, iridium, iridium oxide, ruthenium, ruthenium dioxide, gold, copper or other suitable metal. The additional metal layer may be formed after the first annealing. For example, if the metal used is not compatible with the first annealing temperature, which is the case for gold which allows a maximum temperature around 400° C., the additional metal layer has to be formed after the first annealing.

The final device processing steps further and finally include releasing the movable structure 203 from the substrate 210 to provide a released device. The movable structure 203 may be released, for example, by using chemical release methods known in the art, such as by means of XeF2 etching, so as to provide the structure as shown in FIG. 2.

The stress in the different layers is for example calculated by design to get the theoretical desired or predetermined amount of deflection assuming that the second electrode 216 is annealed at a temperature in the middle of an annealing range which includes temperatures higher than the maximum temperature seen in subsequent processing or operation of the device and lower than the maximum temperature compatible with the metal layers in the device. Any one of the known techniques described in the introduction may be used to facilitate stress balancing. As discussed above, due to the inaccuracy of the modelling of the stress effects of the different layers which form the MEMS switch device 200 (e.g. the different layers which form the movable structure 203 and the actuating structure), the released movable structure 203, even when stress balanced by design, may have an initial deflection relative to the substrate 210. An additional fine adjustment or trimming of the stress is then performed in order to improve the accuracy of the deflection of the movable structure.

Stress in the stress trimming layer (216) of the released MEMS switch device 200 is then adjusted, trimmed or changed such that the movable structure 203 is deflected a predetermined amount relative to the substrate (210) when the released MEMS switch device is in an off state (step 508 in FIG. 5). In an example, stress is changed in the stress trimming layer (216) by determining a value for an anneal parameter for a stress trimming anneal to be performed on the released MEMS device 200, such that after the stress trimming anneal of the released electromechanical transducer device 200, the movable structure (203) is deflected a predetermined amount relative to the substrate 210 when MEMS switch device 200 is in an off state and by then performing a stress trimming anneal on the released MEMS switch device 200 according to the determined value of the anneal parameter. In an example, the anneal parameter is temperature and the determined value of temperature for the stress trimming anneal of the released MEMS device 200 is less than the predetermined value of the anneal performed at step 502. In an example MEMS switch device having a PZT piezoelectric layer 212, the temperature value of the stress trimming anneal is selected to be less than the temperature of the first anneal performed at step 502, which in an example may be 600° C., and so in this example, the stress trimming temperature may be in the range 300-599° C. The stress trimming temperature value is selected so that the stress trimming anneal does not impact the stress levels in the layers of the device annealed by the first anneal.

In an example, the stress trimming annealing temperature value is selected to be higher than the maximum temperature seen in subsequent processing or operation of the device (for example, the temperature seen in the back-end processing of the device, such as during the connection of the device to a board which is typically 300° C.), or the operating temperature of the transducer device in use. In addition, the stress trimming annealing temperature is selected to be lower than the maximum temperature compatible with the metal layers in the device. For example, if gold is used, the maximum temperature is 400° C. In this example, the stress trimming annealing temperature value is selected to be in the range of 300-400° C.

In an example, the thickness of the stress trimming layer (e.g. second electrode 216) may be chosen so that the given range of values for the stress trimming annealing temperature corresponds to a range of possible deflection values which range is larger than the range of deflection values which may be needed (and which may be determined by calculation of uncertainty or experimentally). An optimal accuracy for stress adjustment may be obtained when the thickness of the stress trimming layer is decreased to a minimum value required to obtain the range of deflection needed.

Thus, the stress trimming layer is designed so that its stress change after the stress trimming anneal has been performed has an effect on the deflection of the movable structure so that the desired deflection is achieved. The example method of adjusting the stress in accordance with the disclosure is also arranged so that the stress in the other layers of the MEMs switch device is not changed (e.g. the stress trimming annealing only changes the temperature of the stress trimming layer) or is changed by an insignificant amount. The predetermined amount of deflection may be zero relative to a plane parallel to a surface 209 of the substrate 210 (e.g. for the case when the beam 204 is flat) or may be in a predetermined range of deflection values relative to a plane parallel to the surface 209 of the substrate 210. The desired deflection amount may depend on the application: for example, for a MEMS switch device, it may be required that when the device is in an off state, the movable structure 203 is deflected a certain amount in order to make or break contact with another switch contact pad.

In an example, the value for the stress trimming anneal parameter (e.g. temperature) of the stress trimming anneal of the released device is determined by measuring, after releasing the device during final device processing in step 506 and before performing the stress trimming anneal on the release device, an amount of deflection of the released movable structure 203 relative to the substrate 210. As discussed above, due to the inaccuracy of the modelling of the stress effects of the different layers which form the MEMS switch device 200 (e.g. the different layers which form the movable structure 203 and the actuating structure), the released movable structure 203, even when stress balanced by design, may have an initial deflection relative to the substrate 210 when not actuated.

The amount of deflection may be determined using an optical tool. A difference between the measured amount of deflection and the predetermined amount of deflection which is desired (which may be zero or may be a predetermined value in a range) is then determined. A value for the stress trimming anneal parameter (e.g. anneal temperature) for the stress trimming anneal of the released device so that the released movable structure is then deflected by the determined difference amount to substantially the desired deflection is then determined, for example, by using empirical data. In the case of the stress trimming anneal parameter being temperature, this determined value corresponds to the temperature value of the stress trimming anneal of the released device.

In an example, an additional annealing step may be performed after the stress trimming layer has been formed and at a minimum temperature of the given range of values for the stress trimming annealing temperature so that the deflection measured on release is as close as possible to the targeted deflection.

The first anneal may not be required for devices formed from layers which are not sensitive to temperature.

Figure 11:
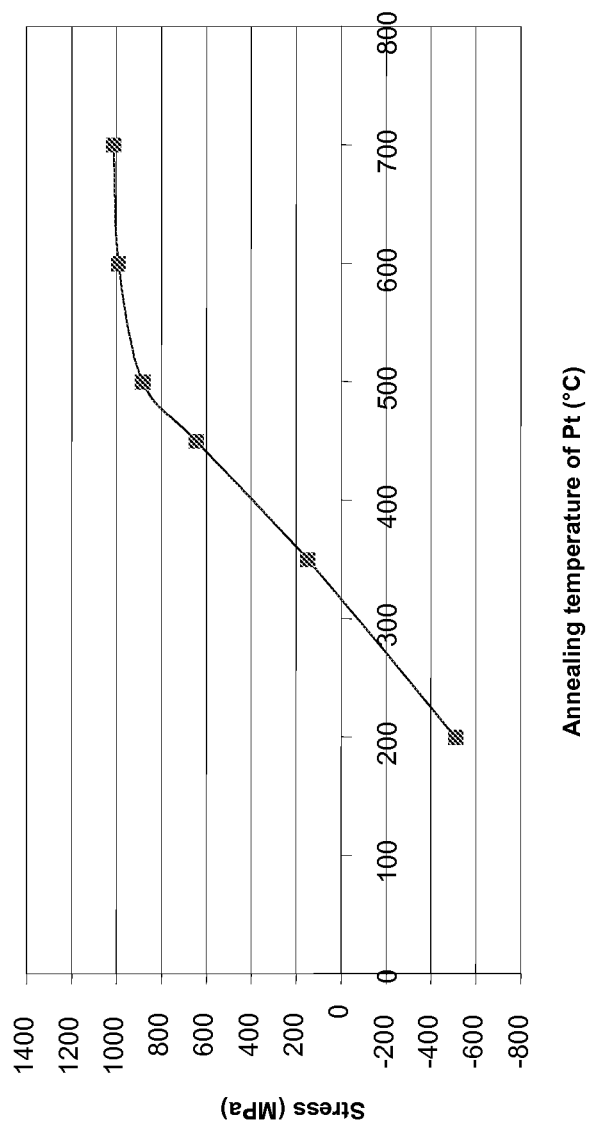
FIG. 11 is a graphical representation of the variation of stress levels in a platinum stress trimming layer of an example device with different anneal temperature values.
Figure 12:
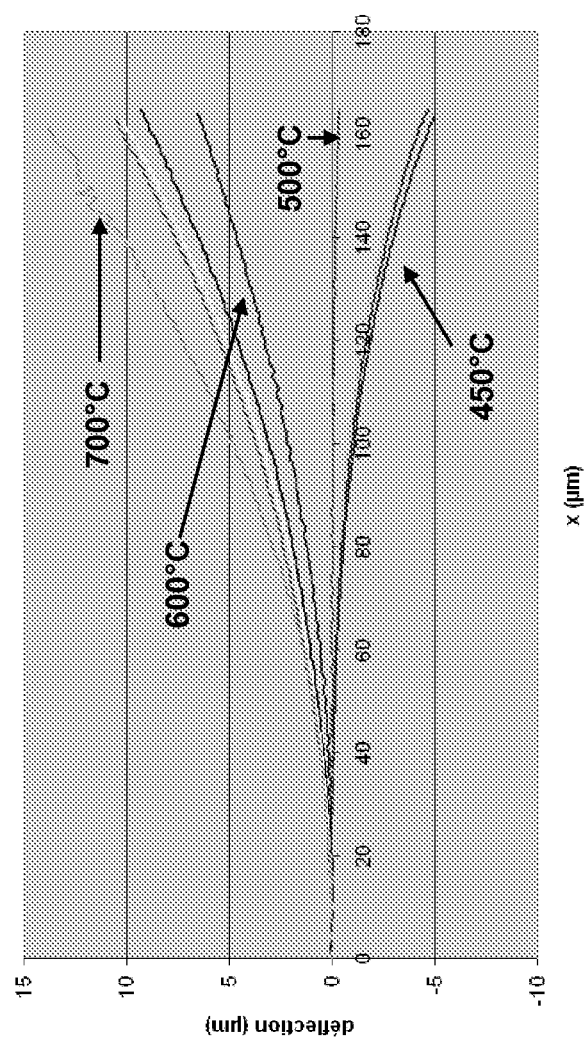
FIG. 12 is a graphical representation of the variation of deflection of the movable structure of an example device having a platinum stress trimming layer with different anneal temperature values.

FIG. 11 is a representation of example empirical data that may be used to determine the temperature value for the stress trimming anneal of the released device. The example empirical data is for a MEMS device having a stress trimming layer formed from platinum (e.g. the stress trimming layer may be a final platinum layer formed during final device processing) and FIG. 12 shows the variation of stress levels in the final platinum layer for a selected method of deposition with different anneal temperature values. The curve in FIG. 11 shows that the stress in platinum increases linearly with temperature in a temperature range between 350° C. and 500° C. to values between 200 MPa and 800 MPa. Once the difference amount between the measured amount of deflection and the predetermined amount of deflection which is desired is determined, a level of stress of the final platinum layer for deflecting the released movable structure by the determined difference amount is then determined (for example, from empirical data) and from the determined level of stress and from the empirical data represented by FIG. 11, the temperature value for the stress trimming anneal of the released device can be determined. In other words, the level of stress in the final platinum layer that is required in order to achieve the desired deflection and then the stress trimming anneal temperature for achieving the required level of stress is determined from empirical data.

Alternatively, empirical data for the variation in deflection changes of the movable structure 203 (including the stress trimming layer) with different anneal temperature values for the stress trimming anneal of the released device may be used with the determined difference amount, between the measured amount of deflection and the predetermined amount of deflection which is desired, to determine the temperature value for the anneal of the released device.

FIG. 12 shows the variation of deflection of the movable structure 203 of an example MEMS device having a stress trimming layer formed from a final platinum layer with different anneal temperature values for the stress trimming anneal of the released device. Thus, by selecting a suitable anneal temperature value, the stress level of the final platinum layer can be adjusted and used to balance the stress gradient of the MEMS device (in the vertical direction which is orthogonal to the surface 209 of the substrate) so that the movable structure 203 can have a desired deflection.

It will be appreciated that typically a plurality of MEMS devices, such as a plurality of MEMS devices 200, are formed on a single wafer (e.g. on substrate 210), with each device comprising a movable structure 203 and an actuating structure. The substrate 210 or wafer will be cut at some stage in order to provide a plurality of separated MEMS devices. The substrate 210 may be cut after performing the stress trimming anneal of the released device in which case the deflection of each of the plurality of MEMS devices on the substrate 210 may be tuned at the same time at the wafer level. For deflection tuning performed at wafer level, in order to save processing time, a certain number of MEMS devices across the substrate 210 may be selected and each selected device used to measure the amount of deflection of the released device and the average measured deflection determined in order to calculate the stress trimming anneal temperature for the stress trimming anneal of the wafer. Alternatively, the substrate 210 may be cut after performing final device processing when the devices are released. However, performing the tuning of the deflection at the wafer level compared to on a device by device basis (e.g. chip level) can improve device yield and reduce manufacturing cost.

When the stress trimming using a stress trimming layer is performed at the chip level (for example for accuracy requirements on a device by device basis), then a different stress trimming annealing temperature can be applied to each device based on a deflection measurement at the chip level. Local deflection measurement can be done by optical measurements. Local heating can be done by a laser or by implementation of a heater on each beam, for example, by using a patterned second electrode as heater or a heater formed as part of or integrated in the movable structure, or a heater which is combined with or part of the stress trimming layer. In an embodiment, the heater may be formed substantially adjacent the stress trimming layer (e.g. formed adjacent above or adjacent below the stress trimming layer and may be in contact with the stress trimming layer or separated from the stress trimming layer by a very thin layer) so as to provide local heating to the stress trimming layer. Local heating of the stress trimming layer, rather than positioning the heater remotely from the stress trimming layer, facilitates the achievement of a higher temperature for heating the stress trimming layer and less heat is generated in other parts of the device which reduces the changing of the stress in the other layers. In the case when the second electrode is patterned as a heater, the design may be chosen so that it has a predetermined resistance as heater and so that its surface is maximum (or optimum) as a piezoelectric electrode. FIG. 13 shows an example design for a heater 1300 that may be used in an electromechanical transducer device and that provides uniform heating. The example design shown 1300 in FIG. 13 may be used for the second electrode and in the case when the second electrode is a stress trimming layer, the example design 1300 may thus be used for the stress trimming layer, the heater and a piezoelectric electrode. Thus, the stress trimming layer may be used as a local heater when stress trimming is performed at the chip level. If the stress trimming layer is used as a local heater and/or pulses of heat are used to change the stress trimming anneal temperature during the trimming only in the stress trimming layer, then the maximum temperature can be higher than the temperature which can be applied directly to the other layers without changing significantly their stress.

The use of a local heater (such as heater 1300) in the MEMS devices enables for the stress to be trimmed in the stress trimming layer 216 on a device by device basis which provides optimum control of the final deflection of the movable structure 203 for each device when the device is in an off state.

A specific example of a method of forming an electromechanical transducer device in accordance with an embodiment of the disclosure will now be described.

The electromechanical transducer is an electrostatic actuator using for example a 100 μm long and 800 nm thick SiN mechanical beam with a stress trimming layer formed by a top Pt layer of 200 nm in a Pt stack formed on the mechanical beam. The design chosen (thickness and length) is obtained from the mechanical requirement on the actuator (elasticity).

The stress in the SiN mechanical beam is chosen to be 950 MPa and the stress of the top Pt layer is induced by a first annealing for example around 450° C. before the release to obtain around 600 MPa of residual stress in the Pt. For this design, the mechanical beam is supposed to be flat: in other words, the desired deflection of the movable structure is zero.

The uncertainty on the deflection for a given stress uncertainty is proportional to the thickness of the layers. In our case the deflection due to a variation of 10 MPa of the stress in the Pt or the SiN is around 1 μm.

The example stress trimming method proposed in the present disclosure can be applied to decrease the uncertainty on the deflection. The first annealing is chosen to be at 450° C. to obtain a 600 MPa stress in the first Pt layer of the Pt stack. After the first annealing of the SiN and Pt stack, a top layer of Pt is put on top of the stack. Assuming the temperature requirement for the final device is for example 300° C., the temperature range for stress trimming annealing is chosen to be 350-450° C. which gives a range of 200 to 600 MPa for the stress in this top Pt layer for the process conditions given as examples. The thickness of the top Pt layer is defined so that the stress trimming annealing temperature range can cover the uncertainty on deflection due to uncertainty on stress on the other layers. By choosing ±10 MPa as value for uncertainty, the deflection to be compensated is 2 μm and this results in a thickness of around 20 nm for the stress trimming layer, the top Pt layer. For the mid range value for the top Pt layer (400 MPa), 950 MPa for the SiN layer and 600 MPa for the first Pt layer, the mechanical beam is flat. The range of stress available for the top Pt layer can compensate the uncertainty induced by the uncertainty on the stress of the SiN layer or the first Pt layer.

Before release, the full stack is annealed for example at 350° C. and the deflection after the release is measured to determine the temperature required for the stress trimming annealing. Since the thickness of the top Pt layer is 10 times smaller than the thickness of the other layer(s) in the Pt stack, the accuracy is increased by a factor of 10. An uncertainty of 10 MPa on the stress of this layer corresponds to an uncertainty of 0.1 μm on the deflection.

The different parameters for this specific example are defined by:

the possible value of stress of the Pt at a reasonable high value temperature (chosen here to be 600 MPa at 450° C.);

the range of temperature which can be used for the final stress trimming, defined by the min. temperature of use and the first annealing temperature, (350-450° C.) which defined the mid-range temperature (400° C.) and then the range of stress (200-600 MPa) and the mid-value of stress for the stress trimming layer (400 MPa)

the thickness of the top Pt layer which is chosen to be able to cover the deflection uncertainty coming from the stress uncertainty (assumed to be ±10 MPa on each layer) for a 400 MPa range.

the stress in the mechanical beam is chosen so that the beam has the targeted deflection (no deflection in this example) for mid-value of stress for the stress trimming layer.

A first set of values for the last two parameters (thickness of the top Pt layer and stress in SiN mechanical layer) can be obtained by using the thin layer model and assuming that the Young Modulus have the same values. It gives for example the simplified following equations $$h_1 \cdot \Delta\sigma = h_2 (\sigma_{max} - \sigma_{min}) \qquad \text{Equation 8}$$

$$h_1 \cdot (\sigma_0 - \sigma_1) = h_2 \cdot (\sigma_2 - \sigma_0) \qquad \text{Equation 9}$$

where:

$\sigma i$ is the stress in layer i, $\sigma min$ and $\sigma max$ are the min and max values of stress in the top Pt layer defined by the temperature range, $\Delta\sigma$ is the stress uncertainty equivalent value, 0 is for mechanical beam, 1 is for the first Pt layer, 2 is for the top Pt layer.

More precise values given here are then obtained by using the full model described above.

As discussed above, for simplicity the manufacture of only part of a transducer device has been described. It would be clear to a person skilled in the art how to form other elements of the device such as the switch contact pads.

In summary, an example method in accordance with the disclosure provides a method of adjusting stress of an electromechanical transducer device comprising a movable structure and an actuating structure formed on a substrate in order to control more accurately the final deflection of the movable structure when the device is in an off state. Since stress is changed in a stress trimming layer once the electromechanical transducer device has been released (e.g. once the device has been substantially manufactured) and in an example by measuring the amount of deflection of the released movable structure relative to the substrate, this enables stress in the multi-layered structure to be trimmed to take account of unwanted variations in deflection of the movable structure due to manufacturing process variations and to inaccuracy in the stress adjustments made during the design process. An example stress trimming method selects a value for a stress trimming anneal temperature for a stress trimming anneal performed after the device is released so as to adjust a stress level in a stress trimming layer so that the movable structure is deflected by a predetermined amount. The stress trimming method may be performed at wafer level for a plurality of devices on a substrate.

An example method in accordance with embodiment of the present invention proposes an approach which relies on the use of a two step adjustment of the residual stress on some layers of the electromechanical transducer device with the two steps having the same relative accuracy requirement on the stress value control on a given layer but with two different ranges of effect on the deflection of the movable structure. A first adjustment step involves a first adjustment by design which gives a first range of uncertainty for the deflection. A second adjustment step (e.g. a trimming step) involves a second fine adjustment with the same relative accuracy on the stress control but with a reduced range of adjustment on deflection which allows for an increase in the final accuracy.

The present invention proposes to use a specific layer (the stress trimming layer) in which the stress can be adjusted at the end of the process by an appropriate trimming method. This layer is designed so that its stress change when applying the trimming method has just the required effect on the deflection which means that a large accuracy on the trimming parameters is not required; the trimming method is also chosen not to change the stresses in the other layers.

In the above, the invention has been described with reference to a cantilevered beam structure. It will however be appreciated that the thermal compensation layer as described above can be applied to other beam arrangements (e.g. doubly supported beams) or plates or similar arrangements with at least one free end or at least one unsupported end or clamped structures (with supported or clamped ends) and is not limited to cantilevered beam structures. More generally, the stress trimming method proposed in the present disclosure can be applied to devices that are designed to be actuated by using the generation of stress in a layer to induce a bending moment.

In the above, the invention has been described with reference to a electromechanical transducer device having a thermal compensation layer. It will be appreciated however that the invention may also be used to form a electromechanical transducer device having a predetermined deflection without the need for a thermal compensation layer.

In the foregoing specification, the invention has been described with reference to specific examples of embodiments of the invention. It will, however, be evident that various modifications and changes may be made therein without departing from the broader scope of the invention as set forth in the appended claims.

The invention claimed is:

1. A method of forming an electromechanical transducer device comprising:
   forming on a fixed structure a movable structure and an actuating structure of the electromechanical transducer device, wherein the movable structure is arranged in operation of the electromechanical transducer device to be movable in relation to the fixed structure in response to actuation of the actuating structure;
   providing a stress trimming layer on at least part of the movable structure;
   after providing the stress trimming layer, releasing the movable structure from the fixed structure to provide a released electromechanical transducer device; and
   after releasing the movable structure, changing stress in the stress trimming layer of the released electromechanical transducer device by performing a stress trimming anneal according to an anneal parameter determined in response to an amount of deflection of the released movable structure relative to the fixed structure, such that the movable structure is deflected a predetermined amount relative to the fixed structure when the electromechanical transducer device is in an off state.

2. The method of claim 1, wherein determining a value for the anneal parameter comprises:
   measuring, after releasing the movable structure and before performing the stress trimming anneal, the amount of deflection of the released movable structure relative to the fixed structure;
   determining a difference between the measured amount of deflection and the predetermined amount of deflection; and
   determining a value for the anneal parameter for deflecting the released movable structure by the determined difference amount.

3. The method of claim 2, further comprising determining a level of stress of the stress trimming layer for deflecting the released movable structure by the determined difference and wherein the determining the value for the anneal parameter comprises determining the value for the anneal parameter corresponding to the determined level of stress.

4. The method of claim 1, further comprising performing, prior to providing the stress trimming layer, a second anneal of the movable structure and the actuating structure formed on the fixed structure according to a second anneal parameter having a second predetermined value.

5. The method of claim 4, wherein the second predetermined value is greater than the anneal parameter for the stress trimming anneal performed on the released electromechanical transducer device.

6. The method of claim 2, wherein the anneal parameter is at least one of temperature and time.

7. The method of claim 6, wherein the anneal parameter is temperature and wherein the stress trimming layer is arranged such that a value for the anneal temperature is in a range of values greater than a maximum temperature value required for subsequent processing or operation of the electromechanical transducer device and less than a maximum temperature value required to ensure no or insignificant change to stress in other layers of the electromechanical transducer device.

8. The method of claim 7, further comprising performing an additional anneal on the electromechanical transducer device before releasing the movable structure at a temperature having a value corresponding to a minimum value of the range of values for the anneal temperature.

9. The method of claim 6, wherein the anneal parameter is temperature and wherein a thickness of the stress trimming layer is arranged such that a value for the anneal temperature is in a range corresponding to a range of deflection amounts that is larger than a range of deflection amounts required for the determined difference amount.

10. The method of claim 1, further comprising providing a heater on or as part of the movable structure, wherein the step of performing a stress trimming anneal comprises performing the stress trimming anneal using the heater.

11. The method of claim 10, wherein the heater is formed from the stress trimming layer.

12. The method of claim 1, wherein forming on the fixed structure a movable structure and an actuating structure of the electromechanical transducer device comprises forming a plurality of electromechanical transducer devices on a substrate comprising a movable structure and an actuating structure, and the method further comprises after performing the stress trimming anneal of the released electromechanical transducer devices, cutting the substrate to provide a plurality of separated electromechanical transducer devices.

13. The method of claim 1, wherein forming on the fixed structure a movable structure and an actuating structure of the electromechanical transducer device comprises forming a plurality of electromechanical transducer devices on a substrate comprising a movable structure and an actuating structure, and the method further comprises after releasing the movable structure, cutting the substrate to provide a plurality of separated electromechanical transducer devices.

14. The method of claim 1, wherein the predetermined amount includes a predetermined range of deflection values relative to a plane parallel to a surface of the fixed structure.

* * * * *